US009369804B2

(12) United States Patent
Buck et al.

(10) Patent No.: US 9,369,804 B2
(45) Date of Patent: Jun. 14, 2016

(54) MEMS MEMBRANE OVERTRAVEL STOP

(71) Applicants: Akustica, Inc., Pittsburgh, PA (US); Robert Bosch GmbH, Stuttgart (DE)

(72) Inventors: Thomas Buck, Tamm (DE); John Zinn, Canonsburg, PA (US); Andy Doller, Sharpsburg, PA (US); Brett Diamond, Pittsburgh, PA (US); Bernhard Gehl, Wannweil (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/444,136

(22) Filed: Jul. 28, 2014

(65) Prior Publication Data

US 2016/0029126 A1 Jan. 28, 2016

(51) Int. Cl.

| | |
|---|---|
| ***H01L 29/84*** | (2006.01) |
| ***H01L 23/58*** | (2006.01) |
| ***H01L 27/088*** | (2006.01) |
| ***H01L 23/48*** | (2006.01) |
| ***H04R 7/06*** | (2006.01) |
| ***H04R 19/00*** | (2006.01) |
| ***H04R 19/04*** | (2006.01) |
| ***H04R 7/20*** | (2006.01) |
| ***H04R 31/00*** | (2006.01) |

(52) U.S. Cl.

CPC .. *H04R 7/06* (2013.01); *H04R 7/20* (2013.01); *H04R 19/005* (2013.01); *H04R 19/04* (2013.01); *H04R 31/003* (2013.01); *H04R 2201/003* (2013.01); *H04R 2207/021* (2013.01)

(58) Field of Classification Search

CPC ............ H01L 28/40; H01L 2924/1461; H01L 2224/48247; H01L 2224/48091; H01L 2224/48465; H04R 23/05; H04R 19/005; H04R 7/06; H04R 7/20; H04R 19/04; H04R 19/05; H04R 31/003; H04R 2201/003; H04R 2207/021

USPC ..................... 257/416, 48, 51, 401, 415, 774, 257/E21.499, 419, E31.113; 438/283; 381/174; 367/181; 310/300

See application file for complete search history.

(56) References Cited

U.S. PATENT DOCUMENTS

| | | | | |
|---|---|---|---|---|
| 5,146,435 | A * | 9/1992 | Bernstein | G01H 11/06 29/25.42 |
| 5,870,482 | A * | 2/1999 | Loeppert | B81B 3/0072 381/174 |
| 7,023,066 | B2 | 4/2006 | Lee et al. | |
| 7,912,235 | B2 | 3/2011 | Chen | |
| 8,625,823 | B2 | 1/2014 | Buck | |
| 2006/0215858 | A1* | 9/2006 | Pedersen | B81B 3/0072 381/191 |
| 2006/0280319 | A1 | 12/2006 | Wang et al. | |
| 2007/0261910 | A1* | 11/2007 | Kasai | G01H 11/06 181/142 |
| 2009/0218642 | A1* | 9/2009 | Miller | B81C 1/00182 257/416 |
| 2010/0002543 | A1* | 1/2010 | Schlosser | H04R 19/005 367/181 |
| 2010/0175477 | A1 | 7/2010 | Kasai et al. | |
| 2011/0108933 | A1 | 5/2011 | Nakatani | |
| 2012/0326249 | A1* | 12/2012 | Rombach | H04R 19/005 257/416 |
| 2013/0016859 | A1 | 1/2013 | Buck | |

FOREIGN PATENT DOCUMENTS

| | | |
|---|---|---|
| EP | 2214421 A1 | 8/2010 |

* cited by examiner

*Primary Examiner* — Long K Tran
*Assistant Examiner* — Dzung Tran
(74) *Attorney, Agent, or Firm* — Maginot, Moore & Beck LLP

(57) ABSTRACT

A micro electrical mechanical system (MEMS) device in one embodiment includes a substrate defining a back cavity, a membrane above the back cavity, a back plate above the membrane, and a first overtravel stop (OTS) positioned at least partially directly beneath the membrane and supported by the back plate.

11 Claims, 7 Drawing Sheets

MEMS MEMBRANE OVERTRAVEL STOP

FIELD

The present disclosure relates to micro electrical mechanical system (MEMS) devices, and more particularly to a vertical overtravel stop for a MEMS device.

BACKGROUND

MEMS Microphones are extremely sensitive pressure sensors. At the lower end of the dynamic range, a MEMS microphone can detect pressure fluctuations of 1/1000 Pa or even less. During manufacturing, assembly, and use, a MEMS microphone may also be subjected to static or dynamic pressure pulses of up to at least one bar (100000 Pa). For example, some individuals direct pressurized air at the devices in order to clean the devices, although this practice is typically not recommended. The large dynamic range (1/1000 Pa to 1000000 Pa) is typically accommodated by incorporating dedicated overtravel stop structures (OTS) that limit the movement of the membrane under extreme overload conditions.

The OTS protects the membrane and also prevents shorting between the membrane and an adjacent electrode which is used to detect deflection of the membrane. Contact between the membrane and the electrode can create a short and presents the potential for destruction of the electronics, or the MEMS structure itself. In some approaches, electronic protection is provided by series resistors or insulating layers on top of the OTS. The use of series resistors requires careful design of the electronics, and the use of insulating layers increases the complexity/cost of the device significantly and may even be impossible due to process constraints. In addition, an insulating layer on top of the OTS is not an ideal solution as long as the membrane and the OTS are at different electrical potentials. In this case, electrostatic forces can decrease the pull-in voltage and/or provide sufficient force to keep the membrane stuck to the electrode, typically the back plate, after contact. Additional circuitry may be required to detect such failures and switch off the system to allow the membrane to release from electrode.

Of course, even if protection from overtravel in the direction of the electrode (back plate) is provided, the device can still be damaged by overtravel away toward the substrate. While various attempts have been made to provide for OTS in the direction of the substrate, the known approaches require increased fabrication costs or incur other disadvantages. In devices which use the substrate above which a membrane is suspended as an OTS, a back cavity is formed in the substrate and the edge of the cavity functions as an OTS. This approach does not require additional manufacturing steps. However, the cavity is formed from the back side of the device while the membrane is formed from the front side of the device. Consequently, the mask used to form the cavity must be aligned with features on the opposite side of the device. Aligning backside features to front side features introduces error. Moreover, the process used to form the back side cavity, typically a High Rate Etch (DRIE) process, is less precise than other processes.

Another embodiment of this approach includes a main backside cavity that is only etched partially through the substrate. Inside this large cavity, a second cavity is formed to extend completely through the substrate. While this can reduce variations resulting from the etch processes involved, it still requires front side-to-back side alignment.

Because of the inherent inaccuracies in backside formation of OTS, devices incorporating the above described OTS must be designed to accommodate the described errors. Thus, the size of the devices is increased in order to ensure sufficient overlap between the membrane and the substrate portion providing the OTS. This increases material costs and introduces wasted space in the device. Moreover, even in an optimized production process, the variability of the overlap in the above described approaches creates variable robustness and also a variable capacitive load as well as a risk of electrical pull-in to the substrate. All of these shortcomings must be accommodated in the design of the device.

The shortcomings above were addressed by a system described in U.S. Pat. No. 8,625,823 which issued on Jan. 7, 2014. In the '823 Patent, existing layers of a device are modified to create an OTS that does not have the disadvantages of the previous approaches while not incurring additional processing costs. Specifically, an OTS portion of the back plate is connected directly to the membrane and insulated from the rest of the back plate by a trench formed by etching. The OTS portion moves together with the movable membrane and contacts an unreleased portion of the membrane layer which is supported by the back plate to limit travel toward the cavity. This approach greatly increases the robustness of the device. There may still be situations, however, where even greater robustness is needed. For example, because the OTS structures must be electrically isolated, robustness is compromised due to the limited number of OTS which can be placed around the membrane. Thus, the approach of the '823 Patent is inherently inferior to an OTS which extends completely about the membrane.

In view of the foregoing, it would be advantageous to provide an accurately positioned OTS. It would be advantageous if the OTS could be incorporated using known MEMS processes. It would be further advantageous if the OTS could be easily adapted to provide increased/decreased robustness for particular applications.

SUMMARY

In accordance with one embodiment, a micro electrical mechanical system (MEMS) device includes a substrate defining a back cavity, a membrane above the back cavity, a back plate above the membrane, and a first overtravel stop (OTS) positioned at least partially directly beneath the membrane and supported by the back plate.

In another embodiment, a method of forming a micro electrical mechanical system (MEMS) device includes forming a first oxide layer above a substrate, forming a socket layer on an upper surface of the first oxide layer, forming a second oxide layer on an upper surface of the socket layer, forming a membrane layer on an upper surface of the second oxide layer, forming a sacrificial oxide layer on an upper surface of the membrane layer, forming a back plate layer on an upper surface of the sacrificial oxide layer, forming a back cavity in the substrate, shaping the socket layer through the back cavity and the first oxide layer; and etching the sacrificial oxide layer, the first oxide layer, and the second oxide layer after the socket layer has been shaped.

BRIEF DESCRIPTION OF THE DRAWINGS

The accompanying drawings illustrate various embodiments of the present disclosure and together with a description serve to explain the principles of the disclosure.

FIG. 16A depicts a partial cross-sectional view of a MEMS device which can be formed using the process of FIGS. 6-12 which includes an OTS located beneath a membrane and supported by a back plate located above the membrane, along with an internal OTS portion;

Corresponding reference characters indicate corresponding parts throughout the several views. Like reference characters indicate like parts throughout the several views.

DETAILED DESCRIPTION OF THE DISCLOSURE

Figure 1:
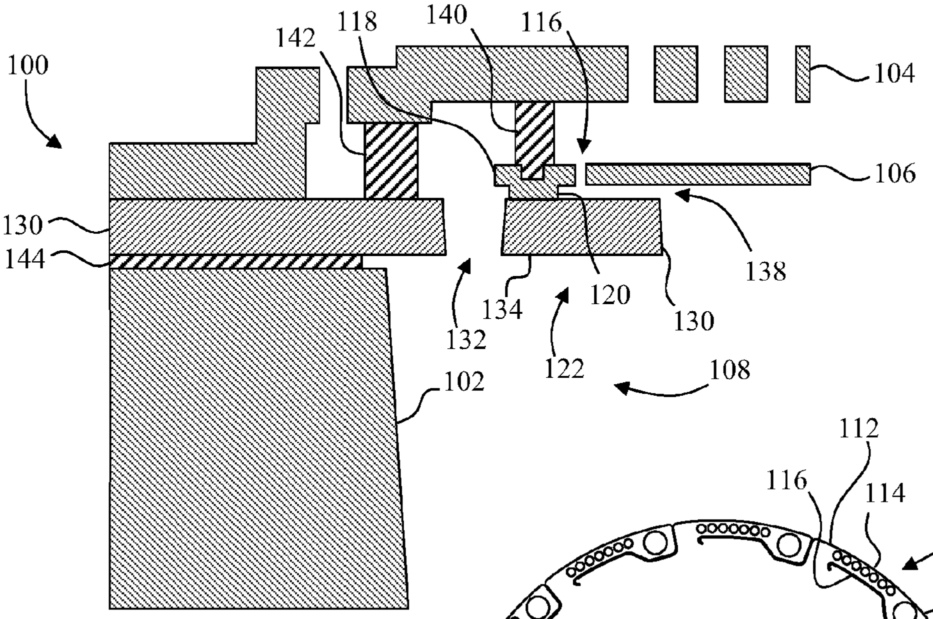
FIG. 1 depicts a partial cross-sectional view of a MEMS device including an OTS located beneath a membrane and supported by a back plate located above the membrane.

While the systems and processes described herein are susceptible to various modifications and alternative forms, specific embodiments thereof have been shown by way of example in the drawings and will herein be described in detail. It should be understood, however, that there is no intent to limit the systems and processes to the particular forms disclosed. On the contrary, the disclosure is to cover all modifications, equivalents, and alternatives falling within the spirit and scope of the disclosure.

Figure 2:
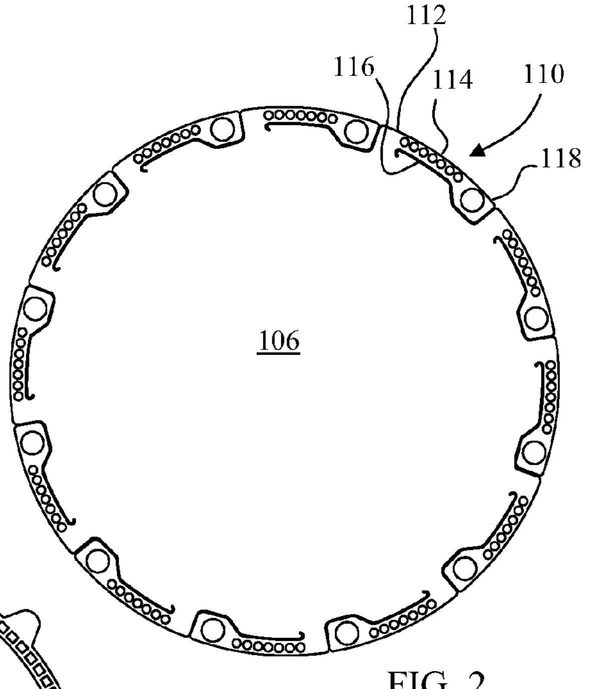
FIG. 2 depicts a top plan view of the membrane of FIG. 1.

Referring to FIG. 1, a MEMS device 100 in the form of a microphone includes a substrate 102, a back plate 104, and a membrane 106. The substrate 102 includes a back cavity 108. The membrane 106 is suspended above the back cavity 108 by a plurality of springs 110 shown in FIG. 2. An end portion 112 of each spring 110 is connected to the membrane 106 while a middle portion 114 of each spring 110 is spaced apart from the membrane 106 by a gap 116.

Figure 3:
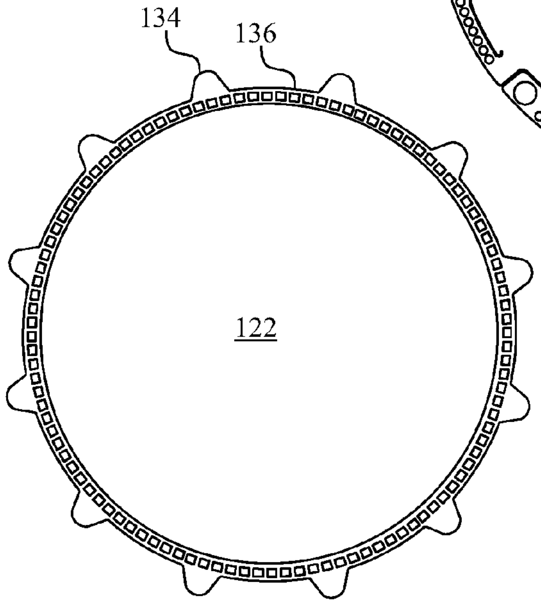
FIG. 3 depicts a top plan view of the OTS of FIG. 1.

The springs 110 further include base portions 118 with extensions 120 (see FIG. 1). The extensions 120 support an OTS 122. The OTS 122 is spaced apart from a remainder of a socket layer 130 by a gap 132. The OTS 122, also shown in FIG. 3, includes a plurality of anchors 134 which are attached to the extensions 120, and a ring portion 136 which is positioned beneath the membrane 106 and spaced apart from the membrane 106 by a gap 138.

Figure 4:
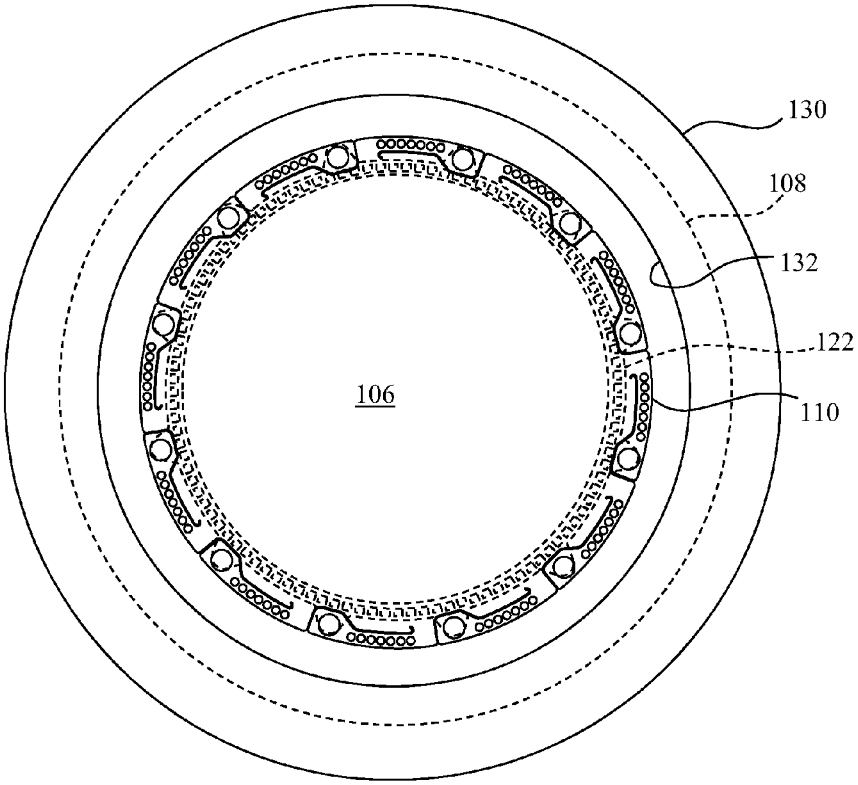
FIG. 4 depicts a partial top plan view of the MEMS device of FIG. 1 with the back plate removed.

The arrangement of the membrane 106 and OTS 122 is further shown in FIG. 4 wherein the MEMS microphone 100 is depicted with the back plate 104 removed. As shown in FIG. 4, both the membrane 106 and OTS 122 are located within the footprint of the back cavity 108. In other words, when the back cavity 108, membrane 106, and OTS 122 are projected onto a plane parallel to the membrane 106, the wall defining the back cavity 108 surrounds both the membrane 106 and OTS 122 as depicted in FIG. 4.

Returning to FIG. 1, the membrane 106 and OTS 122 are suspended above the back cavity 108 by an anchor 140 which is connected to the back plate 104. The anchor 140 is a non-conductive oxide which electrically isolates the membrane 106 and OTS 122 from the back plate 104. The back plate 104 is in turn supported by the socket layer 130 through an anchor 142 which electrically isolates the back plate 104 from the socket layer 130. A portion of the socket layer 130 is supported above the substrate 102 by an oxide layer 144. While not shown in FIG. 1, in some embodiments at least a portion of the socket layer 130 is directly supported by the substrate 102 by removal of a portion of the oxide layer 144.

Figure 5:
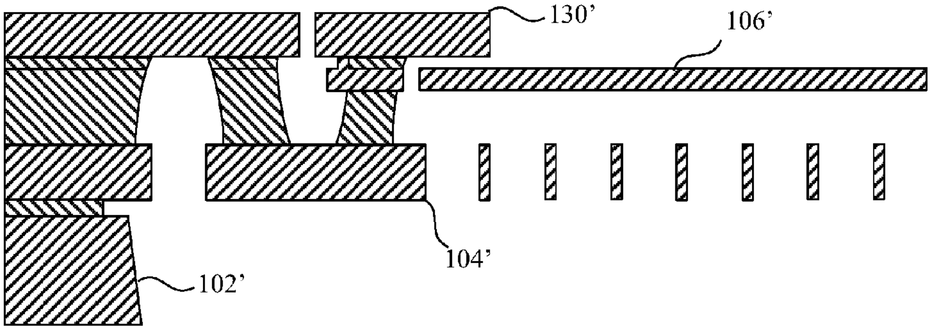
FIG. 5 depicts a partial cross-sectional view of a MEMS device including an OTS located above a membrane and supported by a back plate located below the membrane.

Though FIG. 1 shows the membrane 106 above the socket layer 130 and the back plate 104 above the membrane 106, the same inventive socket layer can be incorporated in a MEMS system with the back plate 104' above the substrate 102', and the membrane 106' above the back plate 104', and the socket layer 130' above the membrane as depicted in FIG. 5. Thus, the use of the socket layer as an overtravel stop for membrane motion away from the back plate can be achieved independent of the relative position of the membrane to the back plate.

Figure 6:
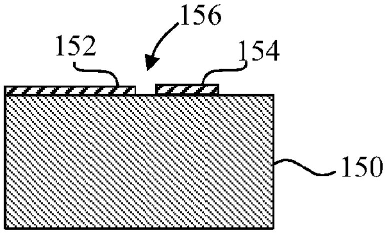
FIGS. 6-12 depict partial cross-sectional views of a process of forming the MEMS device of FIG. 1.

The MEMS device 100 provides a number of advantages. One advantage is that the OTS 122 is shaped from the front side of the device. FIGS. 6-12 depict one process for forming the MEMS device 100 using known MEMS forming processes. Initially, a substrate 150, typically silicon, is provided (FIG. 6). Next, a lower thin oxide layer is deposited onto the upper surface of the substrate 150. The lower thin oxide layer, and other layers discussed below, may be planarized using chemical mechanical polishing (CMP). The lower oxide layer is then structured using any desired process to define the shape of the socket layer as discussed below. As depicted in FIG. 6, the lower oxide layer is etched to form lower oxide portions 152 and 154 which are separated by a space 156.

Figure 7:
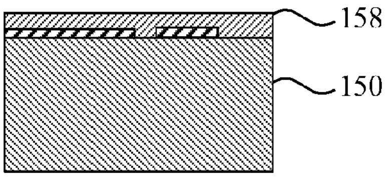
Figure 8:
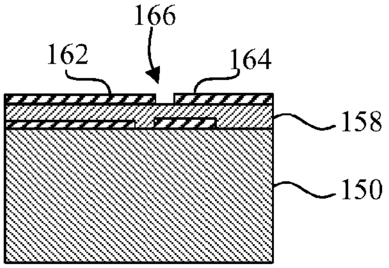

A socket layer 158 is formed on the upper surface of the oxide portions 152/154 and the exposed portions of the substrate 152 (FIG. 7). The socket layer is formed in one embodiment using silicon. An upper oxide layer is then deposited over the socket layer 158 and structured to provide upper oxide portions 162 and 164 which are separated by a space 166 (FIG. 8).

Figure 11:
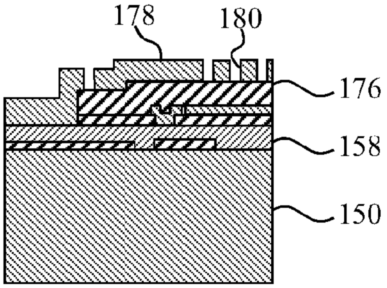

A silicon membrane layer is then deposited on the structured upper oxide layer. A portion of the membrane layer is deposited in the space 166 to form an extension (e.g., extension 120 of FIG. 1). The membrane layer is then structured to form the spring 170 and membrane 172 (FIG. 9) including a gap 174. Next, a sacrificial oxide layer 176 is deposited on the structured membrane layer and upper oxide portion 162. After the sacrificial oxide layer 176 is structured (FIG. 10), a back plate layer is deposited on the structured sacrificial oxide layer and exposed portions of the socket layer 158. The back plate layer (178) is structured as an electrode, including the formation of air holes 180 (FIG. 11).

Figure 12:
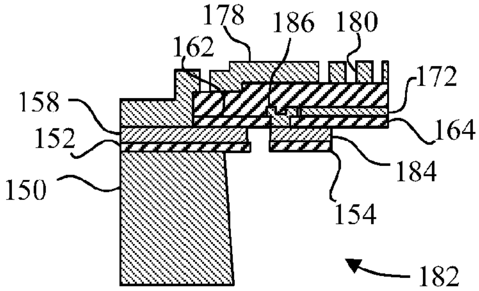

With reference to FIG. 12, the backside cavity 182 is then formed by etching the substrate 150. Etching of the substrate 150 also etches silicon layers not protected by oxide. Specifically, the space 156 (see FIG. 6) between the lower oxide portion 152 and the lower oxide portion 154 allows a portion of the socket layer 158 to be etched, forming the gap 132 of FIG. 1. Additionally, the lower oxide portion 154 defines the portions of the socket layer 158 which form the anchors and ring portion (see, e.g., anchors 134 and ring portion 136 of FIG. 3). The oxide layer of FIG. 6 is thus a mask which is patterned in the shape of the etched socket layer. Thus, if the socket layer is to include multiple rings and struts connecting the rings, the oxide layer will be patterned to include multiple rings and struts connecting the rings. Accordingly, the etching process forms the desired shape of the OTS 184. The etching also forms the perforations shown in the ring portion 136 of FIG. 3.

Finally, the sacrificial oxide is etched using a timed etching process resulting in the configuration of FIG. 1. The timed etching allows the membrane 172 to be released from the back plate 178 as the sacrificial oxide above the membrane 172 is etched primarily through the air holes 180. The trench formed in the socket layer 158 (FIG. 12) also allows etching of the upper oxide layer and sacrificial layer directly above the trench from the backside cavity 182 while trenches in the back plate 178 allow etching of the upper oxide layer and sacrificial layer. By properly timing the etching process, the anchor portions 140 and 142 (see FIG. 1) remain after etching. The lip 186 helps to protect the sacrificial layer directly above the spring 170.

Additionally, the etch process releases the membrane 172 from the OTS 182, and forms the gap 116. The oxide portion 164 thus sets the gap 138 between the membrane 106 and the OTS 122. The perforations in the OTS (see FIG. 3) provide for an increased effective width of the OTS for increased support, while still ensuring that the upper oxide portion 164 is fully etched.

The above described device and process thus provide an additional layer (socket layer) underneath the membrane which is defined only from the topside of the wafer, and released from the backside. This allows for high precision and easy processing. For example, the socket layer requires no structuring during front side processes since the lower oxide layer serves as a mask layer allowing the etching of the socket to be accomplished during the back cavity etch. Using only front side processing to define the critical structures allows a high flexibility in design and leads to small variability in the manufactured microphone structure.

The device and process described above permits a desired thickness and positioning of the OTS for a particular application. The basic design in one embodiment consists of a perforated ring underneath the membrane to support the membrane during overload events. The radial position of the ring is optimized to maximize robustness.

Figure 13:
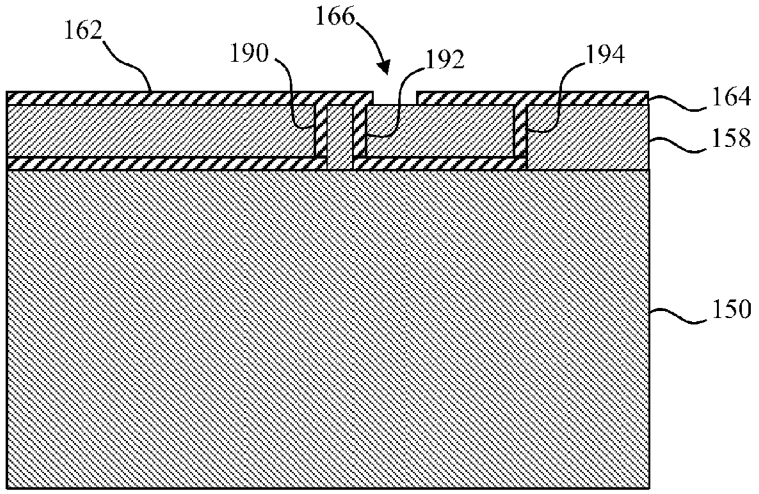
FIG. 13 depicts a partial cross-sectional view of a modification to the process of FIGS. 6-12 which can be incorporated into a process to provide increased manufacturing precision.

In some embodiments, increased precision may be desired in the definition of the socket layer structures. The above described is easily modified to provide the additional precision. By way of example, prior to depositing and structuring the upper oxide portion (see FIG. 8), the socket layer 158 is etched to define the specific dimensions of the structures within the socket layer. Consequently, as depicted in FIG. 13, when the upper oxide layer is formed, the trenches in the socket layer 158 are filled with oxide pillars 190, 192, and 194. Accordingly, during the back cavity etching which forms the gap 132, the sidewalls of the socket layer 158 are protected by the oxide pillars 190, 192, and 194. The process continues as described above with respect to FIGS. 8-12, with the oxide pillars 190, 192, and 194 being removed during the timed etch.

Figure 14:
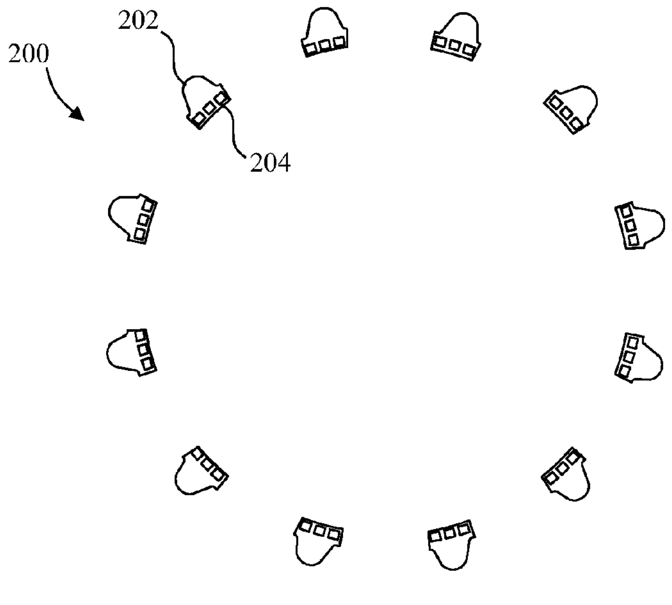
FIG. 14 depicts a top plan view of an alternative OTS with reduced support which can be incorporated into the device of FIG. 1 using the process of FIGS. 6-12.

While the device described above with respect to FIGS. 1-4 provides a complete ring portion 136, this level of support may not be needed in a particular application. The process of FIGS. 6-12 (and 13) can be used to provide a lesser degree of support simply by modification of the lower oxide portion 154. By way of example, FIG. 14 depicts an OTS 200 which can be used in the MEMS Microphone 100. The OTS 200 includes a number of anchors 202 and ring portions 204. The ring portions 204 do not provide a complete ring. Moreover, a lesser or greater numbers of anchors 134 and ring portions 136 may be used. The partial ring embodiments provide less support and improved wet cleaning during manufacturing.

Figure 15:
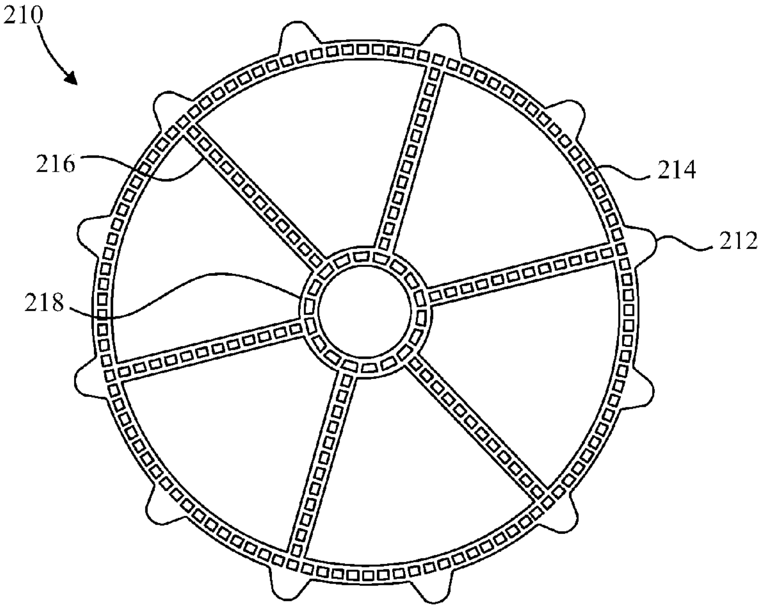
FIG. 15 depicts a top plan view of an alternative OTS with increased support which can be incorporated into the device of FIG. 1 using the process of FIGS. 6-12.

If increased robustness is desired for a particular application, the process of FIGS. 6-12 (and 13) can be used to provide an increased degree of support simply by modification of the lower oxide portion 154. By way of example, FIG. 15 depicts an OTS 210 which can be used in the MEMS Microphone 100. The OTS 210 includes a number of anchors 212 and an outer ring portion 214. The ring portion 214 provides a complete ring. Moreover, a number of OTS struts 216 extend from the outer ring portion 214 to an inner ring portion 218. The struts 216 and inner ring portion 218 provide additional support. The number of struts and inner rings may be modified from that shown in FIG. 15 for a particular application.

Figure 16:
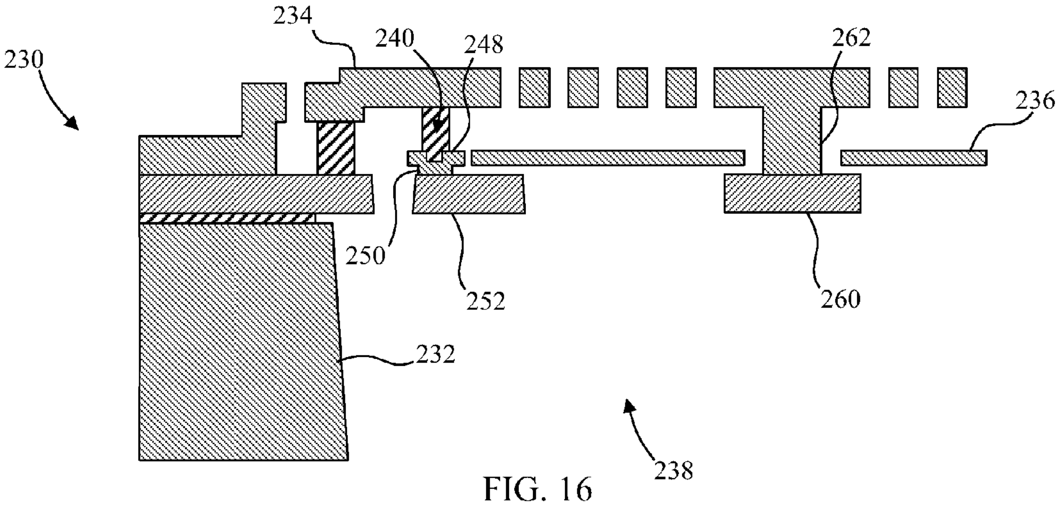
FIG. 16 depicts a partial cross-sectional view of a MEMS device which can be formed using the process of FIGS. 6-12 which includes an OTS located beneath a membrane and supported by a back plate located above the membrane, along with an internal OTS portion.

Moreover, while the embodiments described above provided an OTS that was at the same potential as the membrane, which allows for low parasitic capacitances and also avoids any pull-in between the membrane and the OTS, in embodiments wherein pull-in is not a concern, the process of FIGS. 6-13 may be modified to provide the structure of FIG. 16. In FIG. 16, a MEMS device 230 in the form of a microphone includes a substrate 232, a back plate 234, and a membrane 236. The substrate 232 includes a back cavity 238. The membrane 236 is suspended above the back cavity 238 by a plurality of springs 240 like those shown in FIG. 2 which is spaced apart from the membrane 236 by a gap 246. The springs 240 further include base portions 248 with extensions 250. The extensions 250 support an OTS 252. The OTS 122 is substantially identical to the OTS 122, the OTS 200, or the OTS 210, and supported in the same manner as the OTS 122, the OTS 200, or the OTS 210.

The MEMS device 230 is thus substantially identical to the MEMS device 100 and can be formed using the process of FIGS. 6-13. The layout of FIGS. 6-13 is modified, however, to provide the additional structural features of FIG. 16. Specifically, in addition to the support provided by the OTS 252, the MEMS device 230 includes one or more OTS 260. The OTS 260 is located within the membrane area and supported by the back plate 234 by a support post 262. The OTS 260 is at the same level as the OTS 252. The phrase "same level" as used herein means that the features are formed from the same layer. Accordingly, at least portions of two components which are at the "same level" will be at the same height when viewed in cross section. Consequently, because the OTS 252 and the OTS 260 are at the same level, the gap between the membrane 236 and the OTSs 252 and 260 (set by the oxide layers used to form oxide portions 162/164 of FIG. 7) is very consistent.

The OTS(s) 260 thus provides additional support within the membrane area, but are not electrically isolated from the back plate 234. In some embodiments, electrical isolation is provided by forming an oxide portion 264 between the support post 262 and the OTS 260 from the same layer as the oxide portions 162/164 of FIG. 8 as depicted in FIG. 16A.

Figure 17:
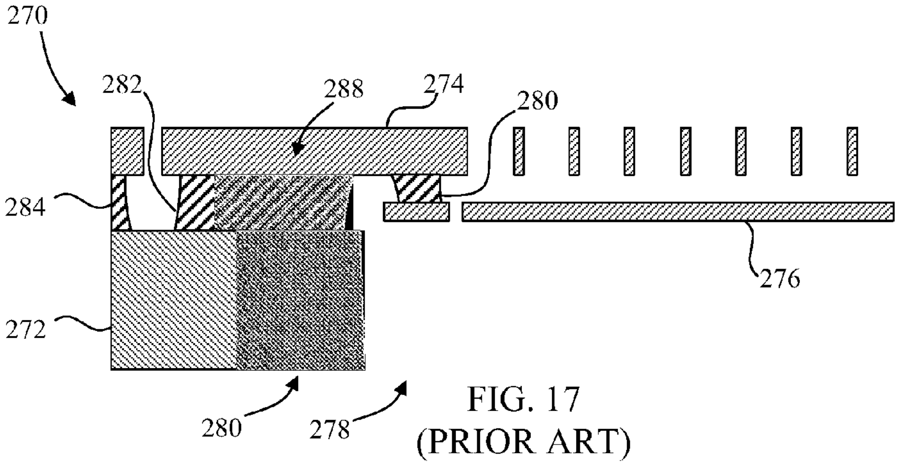
FIG. 17 (PRIOR ART)
FIG. 17 depicts a partial cross sectional view of a prior art MEMS device indicating the variations resulting from a back cavity process.

While the socket layer in the embodiments above has been discussed in the context of providing an OTS, the socket layer may be further used to provide other benefits. By way of example, FIG. 17 depicts a prior art MEMS device 270 including a substrate 272, a back plate 274, a membrane 276, and a back cavity 278. The membrane 276 is supported from the back plate 274 through an anchor 280, while the back plate 274 is supported by the substrate 272 through an anchor 282. The anchors 280/282 are formed in an oxide layer 284.

FIG. 17 further depicts the variability of the back etching process used to form the back cavity 278 as indicated by the shaded portion 286 of the substrate 272. Accordingly, when the oxide layer 284 is etched to form the anchors 280/282, the shaded area 288 in the anchor 282 depicts the variability of the extent of the anchor 282. The size of the anchor 282 must be designed to accommodate this wide variation without compromising the structural integrity of the anchor 282, leading to increased size requirements. Moreover, the variation in anchor size leads to variation in the parasitic capacitance between back plate and substrate. The socket layer described above ameliorates the variability of the anchor extent.

Figure 18:
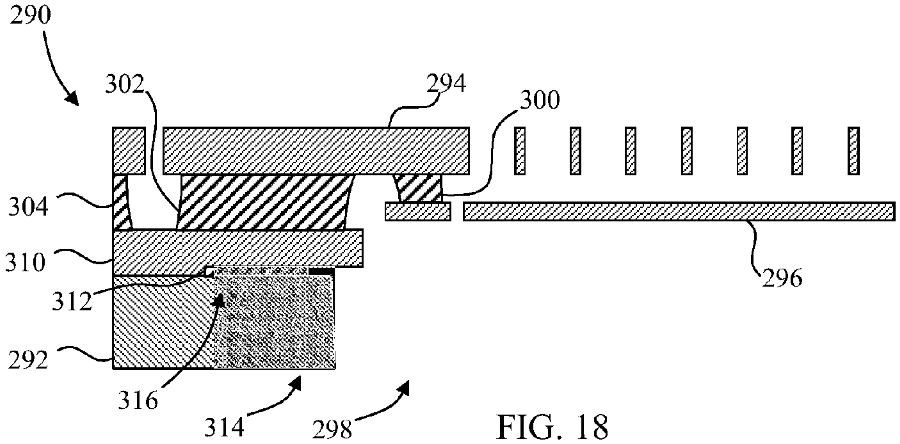
FIG. 18 depicts an partial cross-sectional view of a MEMS device exhibiting reduced variations by incorporating a socket layer.

Specifically, FIG. 18 depicts a MEMS device 290 including a substrate 292, a back plate 294, a membrane 296, and a back cavity 298. The membrane 296 is supported from the back plate 294 through an anchor 300, while the back plate 294 is supported by the substrate 292 through an anchor 302. The anchors 300/302 are formed in an oxide layer 284. The MEMS device 290 further includes a socket layer 310 which is formed partially on the substrate 292 and partially on an oxide portion 312.

The socket layer 310 and oxide portion 312 are formed in the same manner as the socket layer 130 and oxide layer 144 of FIG. 1. The socket layer 310 and oxide portion 312 also protect the anchor portions positioned above them like the socket layer 130 and oxide layer 144.

FIG. 18 further depicts the variability of the back etching process used to form the back cavity trench 298 as indicated by the shaded portion 314 of the substrate 292. The socket layer 310, however, protects the oxide layer 304. Accordingly, when the oxide layer 304 is etched to form the anchors 300/302, there is no variability in the anchor 302 (compare with shaded portion 288 of FIG. 19. Rather, the only variability is realized in the shaded area 316 in the oxide portion 312. This variability can be controlled by limiting the size (lateral extent) of the oxide portion 312 and/or by providing additional direct support of the socket layer 310 by the substrate 292.

Consequently, adding the socket layer protects the back plate anchoring region. The variation of the anchoring and the parasitic effects are significantly reduced. Since a design is typically laid out for the worst case of back cavity opening (shaded areas 280/314), incorporation of a socket layer allows the die size to be reduced while keeping the overall stability constant.

Figure 19:
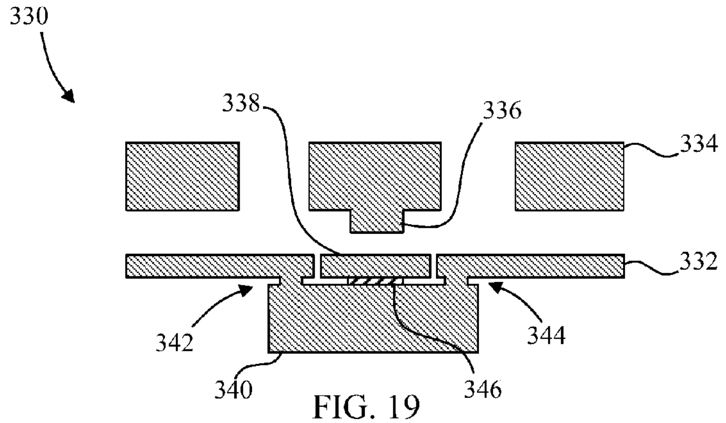
FIG. 19 depicts a partial cross-sectional view of a MEMS device including an isolation portion in a socket layer positioned in opposition to an anti-stiction bump of the back plate.

The socket layer can be further used to isolate anti-stiction bumps. FIG. 19 depicts a portion of a MEMS device 330 including a membrane 332 and a back plate 334. The remainder of the device may be fashioned in the manner of the various embodiments described above. The back plate 304 differs from the other described back plates in that it includes an anti-stiction bump 336. The anti-stiction bump 336 serves as an upper OTS, and the limited surface area reduces the potential for stiction when the back plate 334 and the membrane 332 are at different potentials. In prior art devices, however, contact with an anti-stiction bump and a membrane results in a breakdown in the voltage potential between the membrane and the back plate. In contrast, the anti-stiction bump 336 is located in opposition to an isolated portion 338 of the membrane 332.

The isolated portion 338 is supported by an isolated portion bridge 340 suspended from the membrane 332 by supports 342 and 344. A remainder 346 of the upper oxide layer used to form the oxide portions 162 and 164 of FIG. 8 is located on the isolated portion bridge 340 and supports the isolated portion 338 while electrically isolating the isolated portion 338.

Figure 9:
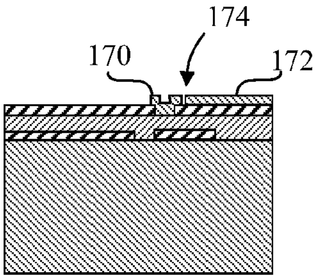
Figure 10:
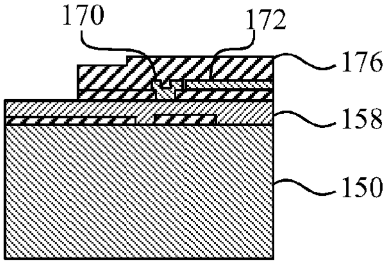

Structuring of the additional components in FIG. 19 is accomplished by simple modification of the process described above with respect to FIGS. 6-13. Specifically, the socket layer 130 is further patterned to provide the isolated portion bridge 340. Then, the upper oxide layer used to form the oxide portions 162/164 of FIG. 7 is further patterned to provide the supports 342/344 which are created when the spring 170 and membrane 172 are formed (FIG. 9). Prior to depositing the sacrificial oxide layer 176, the membrane 172 is etched to define the outer border of the isolation portion 338, and the trenches are filled when the sacrificial oxide layer 176 is deposited. The size of the isolation area is selected to ensure that the timed etching of the sacrificial oxide layer 176 does not eliminate all of the upper oxide layer between the isolated portion bridge 340 and the isolation portion 338, leaving the remainder 346. Accordingly, a dedicated isolation layer is not required to coat the MEMS die.

Figure 20:
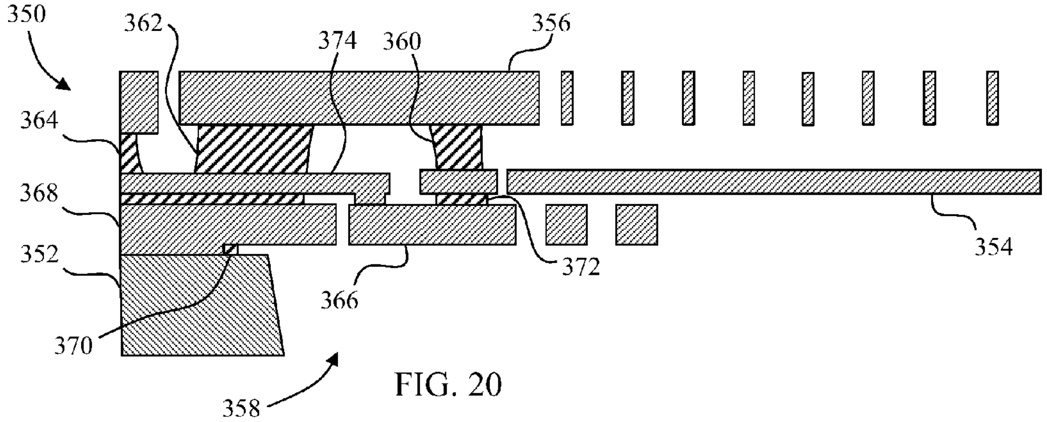
FIG. 20 depicts a partial cross-sectional view of a MEMS device including an OTS located beneath a membrane and supported by a back plate located above the membrane, wherein the OTS is configured as a lower electrode.

By a slight modification of the procedure described in association with the embodiments of FIG. 19, the socket layer OTS can further function as an electrode below the membrane. By way of example, FIG. 20 depicts a MEMS device 350 which includes a substrate 352, a membrane 354, and a back plate 356. The membrane 354 is suspended above a back cavity 358 by an anchor 360 supported by the back plate 356. The back plate 356 is in turn supported by and anchor 362, and the anchors 360/362 are formed from an oxide layer 364.

The MEMS device 350 further includes an OTS 366 positioned below the membrane layer. The OTS 366 is formed from a socket layer 368 which is positioned in part on an upper surface of a remainder 370 of a lower oxide layer and in part on the upper surface of the substrate 352. The MEMS device 350 in those respects is substantially the same as the MEMS device 100. The difference between the embodiment of FIGS. 1 and 20 is that the OTS 366, while supported by the membrane 354, is electrically isolated from the membrane 354 by a portion 372 of the upper oxide layer. Additionally, the OTS 366 is electrically configured as an electrode by a feeder portion 374 of the layer from which the membrane 354 is formed. Thus, the same layers described in FIGS. 6-13 are employed to form the device 350, simply by modifying the shape of the masks.

The MEMS device 350 thus provides fully differential sensing. Applying a negative voltage on the second electrode (OTS 366) and driving it with a negative voltage allows for sensing on two electrodes (OTS 366 and back plate 356) which can be used to double the sensitivity and/or lower the electrical noise by 3 dB.

Alternatively, the MEMS device 350 may be configured as a dual sensitivity microphone. For example, the second electrode (OTS 366) can have a smaller area than the main electrode (back plate 356) and so will have a lower sensitivity by default. This can be used to detect higher sound pressures without overloading the input circuit.

In yet another embodiment, the MEMS device 350 is configured to provide a low power microphone mode. Specifically, the gap between the lower electrode (OTS 366) and the membrane 354 is/may be much smaller than the gap between back plate 356 and the membrane 354. This means, that the OTS 366 can be used with a much smaller bias voltage which may need less stages of a charge pump and so lower current. The drawback is the requirement to drive it very close to pull-in to achieve the necessary sensitivity which will lower the dynamic range to high sound pressure values.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

The invention claimed is:

1. A micro electrical mechanical system (MEMS) device comprising:

a substrate defining a back cavity;

a membrane including a first surface and an opposite second surface and located above the back cavity;

a back plate counter electrode formed in a back plate layer and located in opposition to the membrane first surface, the back plate supported directly or indirectly by the substrate; and a first overtravel stop (OTS) located at least partially in opposition to the membrane second surface and at least partially overlapping a released movable portion of the membrane and supported directly or indirectly by the back plate layer.

2. The MEMS device of claim 1 further comprising a socket layer, wherein:

the socket layer is above the substrate;

the membrane is above the socket layer; and the back plate is above the membrane.

3. The MEMS device of claim 1 further comprising a socket layer, wherein:

the back plate is above the substrate;

the membrane is above the back plate; and the socket layer is above the membrane.

4. The MEMS device of claim 1, further comprising:

a spring supporting the membrane; and an electrically isolating back plate anchor extending downwardly from the back plate and supporting the spring, wherein the first OTS is supported by the back plate.

5. The MEMS device of claim 4, wherein the first OTS comprises:

a first OTS anchor operatively supported by the spring; and a first ring portion directly supported by the first OTS anchor and spaced apart from a second ring portion which is directly supported by a second OTS anchor of a second OTS.

6. The MEMS device of claim 4, wherein the first OTS comprises:

a first ring portion;

a second ring portion encircled by the first ring portion; and a plurality of struts extending between the first ring portion and the second ring portion.

7. The MEMS device of claim 4, further comprising:

an oxide portion located between the spring and the first OTS, the oxide portion electrically isolating the first OTS from the spring; and a feeder portion extending above the substrate and in electrical communication with the first OTS, at least a portion of the feeder portion at a same level as the membrane.

8. The MEMS device of claim 4, further comprising:

a second OTS positioned inwardly from the first OTS, the second OTS supported by the back plate through a downwardly extending support post.

9. The MEMS device of claim 8, wherein the downwardly extending support post is integrally formed with the back plate.

10. The MEMS device of claim 9, further comprising:

an oxide portion located between the support post and the second OTS.

11. The MEMS device of claim 4, further comprising:

an anti-stiction bump extending downwardly from the back plate;

an electrically isolated portion of the membrane positioned in opposition to the anti-stiction bump;

a bridge portion located below the isolated portion of the membrane and supported by the membrane; and an oxide portion located between the isolated portion of the membrane and the bridge portion and electrically isolating the isolated portion of the membrane from the bridge portion.

* * * * *